United States Patent [19]

Fortescue

[11] 4,449,117
[45] May 15, 1984

[54] ENCODER TRACKING DIGITIZER HAVING STABLE OUTPUT

[75] Inventor: Stephen M. Fortescue, Northridge, Calif.

[73] Assignee: Dataproducts Corporation, Woodland Hills, Calif.

[21] Appl. No.: 321,333

[22] Filed: Nov. 13, 1981

[51] Int. Cl.³ .................................................. H03K 13/08
[52] U.S. Cl. .............................. 340/347 SY; 318/660; 318/661; 340/347 M; 340/347 AD
[58] Field of Search .................... 340/347 M, 347 SY; 318/660, 661

[56] References Cited

U.S. PATENT DOCUMENTS 4,390,865 6/1983 Lauro .............................. 318/660 X

OTHER PUBLICATIONS

Millman et al., Pulse and Digital Circuits, McGraw-Hill Book Co., Inc., 1956, pp. 323–327; 394–397; 411.
Boyes, Synchro and Resolver Conversion, Analog Devices, Inc., 9/80, pp. 45–48.
Schmid, Electronic Analog/Digital Conversions, Van Nostrand Reinhold Co., 1970, pp. 236–240; 366–369; 437–458.
The Engineering Staff of Analog Devices, Inc., Analog-Digital Conversion Handbook, 6/72, pp. I-33 & I-34; I-61 through I-67.

Primary Examiner—T. J. Sloyan
Attorney, Agent, or Firm—Spensley, Horn, Jubas & Lubitz

[57] ABSTRACT

A digitizer for receiving sine and cosine encoder signals and providing a digital output representative of the phase angle of the encoder. A counter is used to generate a variable reference angle, and memories are used to generate digital signals representing the sine and cosine of the output of the counter. These signals are multiplied by the analog cosine and sine inputs, respectively, in order to determine the direction of the difference between the encoder phase angle and the counter angle. The counter is incremented or decremented so as to make the digital angle output provided by the counter equal to the phase angle of the encoder. A velocity indication may be provided by the addition of a low pass filter to the circuit.

2 Claims, 2 Drawing Figures

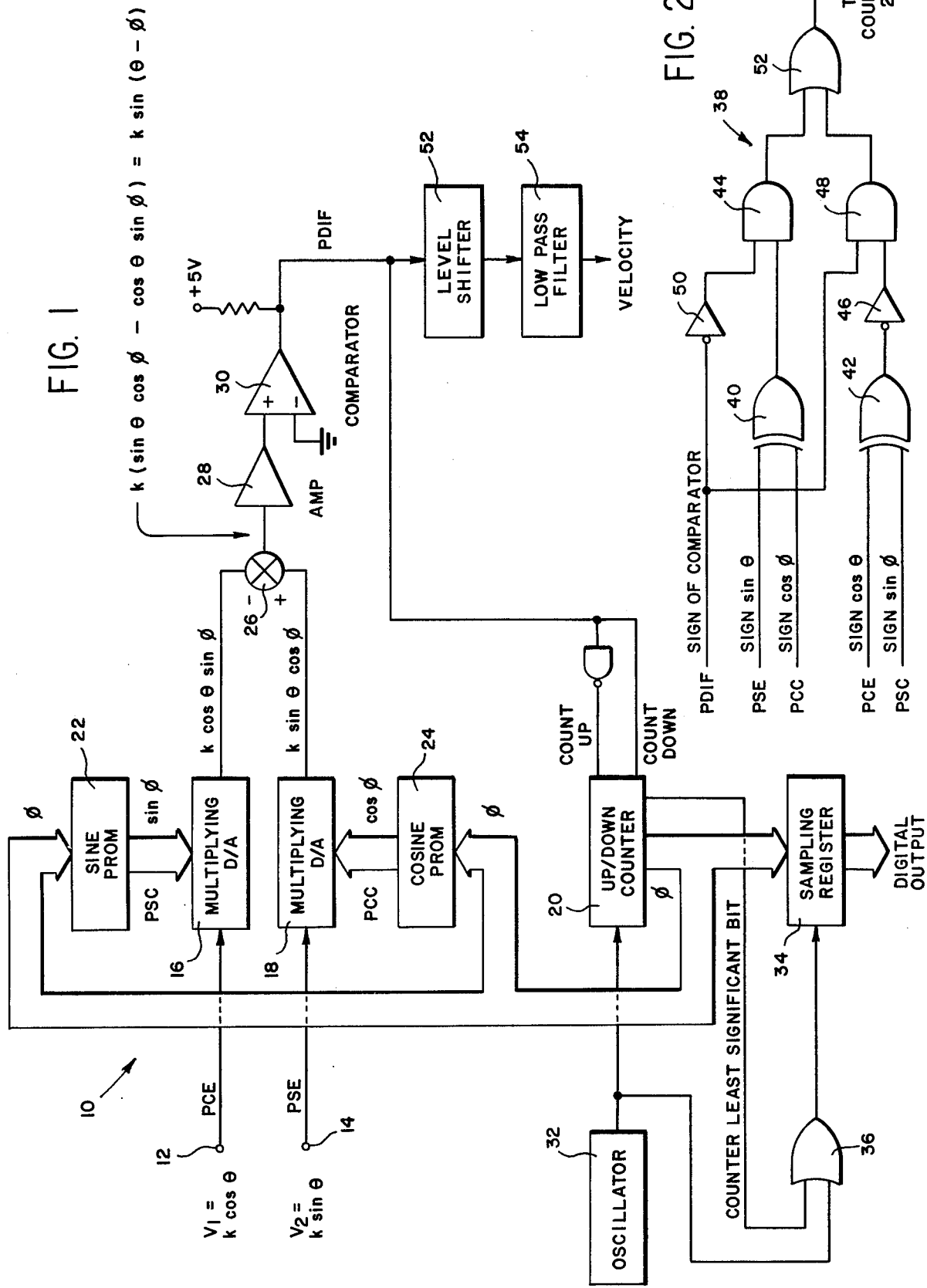

ENCODER TRACKING DIGITIZER HAVING STABLE OUTPUT

BACKGROUND OF THE INVENTION

1. Field of the Invention

This invention relates to a digitizer to provide a digital representation of phase angle, given sine and cosine analog inputs. More particularly, this invention relates to a digitizer for use with capacitive encoders that are amplitude demodulated. Variations in the gap spacing between capacitor plates in such encoders affect the amplitudes of the sine and cosine signals generated by the encoder, although the relative sine and cosine maximum signal amplitudes remain equal to each other. The present invention is designed to eliminate problems caused by such amplitude variations.

2. Description of the Prior Art

Circuitry for providing a digital angle representation as a function of analog sine and cosine inputs is disclosed in U.S. Pat. Nos. 3,624,636 to Diederich, 3,504,361 to Catton and 3,636,544 to Farneth. A digitizer employing sine and cosine analog inputs is also disclosed in EDN, February 1967, volume 12 No. 3, page 67, "Degrees to Cycles to Decimals" by Shatavsky, as well as in U.K. Patent No. 1,201,118 to O'Brien. These publications disclose various methods for the generation of a digital angle signal as a function of sine and cosine analog inputs.

SUMMARY OF THE INVENTION

It is an object of the present invention to provide a simple digitizer which provides an accurate digital output despite variations in amplitude of the sine and cosine analog inputs.

It is a further object of the present invention to provide a digitizer which has the capability for providing an accurate analog output of velocity.

The basis of operation of the present invention is the trigonometric identity $$k \sin(\theta - \phi) = k \sin \theta \cos \phi - k \cos \theta \sin \phi \quad (1)$$

An encoder having a phase angle $\theta$ provides outputs A sin $\theta$ and A cos $\theta$. A counter provides a digital representation of the angle $\phi$. A digital sine/cosine generator employing a read only memory (ROM) provides digital numbers representing the sine and cosine of the counter value. The cosine of the counter value is multiplied by the sine of the encoder phase angle and the sine of the counter value is multiplied by the cosine of the encoder phase angle by means of multiplying digital-to-analog converters. The difference between the two products is detected by a comparator. Because of the trigonometric identity of equation 1, the comparator identifies whether the value k sin $(\theta - \phi)$ is positive or negative. A positive result means that $\phi$ is less than $\theta$ and needs to be increased. This condition causes the counter to be incremented. Likewise, a negative result causes the counter to be decremented. After the counter has had sufficient time to catch up with the encoder phase angle, it will continue track the encoder phase angle such that $\phi$ will be approximately equal to $\phi$, and k sin $(\theta - \phi) = 0$. Thus, the output of the counter will be digital representation of the phase angle $\theta$ of the encoder independent of the value of k.

Given accurate sine and cosine inputs from an encoder, the circuit of the present invention provides a high resolution digital coding of the input phase angle, which coding is insensitive to input amplitude variations.

The digitizer can also be utilizied to provide an accurate velocity indication by the addition of a low pass filter to output of the comparator.

BRIEF DESCRIPTION OF THE DRAWINGS

The invention will be described with reference to the accompanying drawings, wherein:

FIG. 1 is a block diagram of the present invention.

FIG. 2 is a circuit diagram of logic circuitry used with the preferred embodiment of the invention.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention is best defined by the appended claims.

Referring to FIG. 1, the encoding tracking digitizer of the present invention, indicated generally at 10, receives analog inputs V1=k cos $\theta$ and V2=k sin $\theta$ at inputs 12 and 14, respectively. These inputs signals are characterized in that they are very accurate sine and cosine wave forms. However, due to wobble or runout between the plates of the capacitive encoder, the input signals may vary in maximum amplitude (i.e., the value of k may vary). The input signals V1 and V2 are supplied to the reference inputs of a pair of multiplying digital-to-analog converters 16 and 18, respectively. Converters of this type provide analog outputs which are a function of the product of the digital input and the reference voltage.

A bidirectional counter 20 provides a digital output representative of an arbitrary angle $\phi$. The sine and cosine of this angle are provided by programable read only memories (PROM's) 22 and 24, respectively. The digital sine and cosine outputs are utilized as inputs to the converters 16 and 18. Thus, the converter 16 provides an output of k cos $\theta$ sin $\phi$ and the converter 18 provides an output k sin $\theta$ cos $\phi$. The output of the converter 16 is subtracted from the output of the converter 18 by means of a subtractor 26, the output of which is multiplied by an amplifier 28. The amplified output is compared to zero by means of a comparator 30.

The output of the subtractor 26 is equal to k(sin $\theta$ cos $\phi$−cos $\theta$ sin $\phi$). Substituting the trigonometric identity of equation 1, it is seen that the output of the subtractor 26 is also equal to k sin $(\theta − \phi)$. If this value is positive, then $\theta$ is greater than $\phi$. Conversely, if it is negative, then $\theta$ is less than $\phi$. In comparing the amplified output of the subtractor 26 to zero, the comparator 30 will provide a positive output if $\theta$ is greater than $\phi$ (i.e., if k sin $(\theta − \phi)$ is greater than zero) and a negative output if $\theta$ is less than $\phi$ (i.e., if k sin $(\theta − \phi)$ is less than zero).

If the angles $\theta$ and $\phi$ are equal, the term k sin $(\theta − \phi)$ will be equal to zero. The present invention operates to vary the output of the counter 20 so as to make $\phi$ equal to $\theta$. The counting of the counter 20 is controlled by the output of the comparator 30. If $\phi$ is less than $\theta$, the comparator output will be positive and a control signal to the counter will cause it to count in an up direction. Eventually, the value of $\phi$ will catch up to $\theta$. At that point, the output of the subtractor 26 will be zero, and the output of the counter 20 will be an accurate digital representation of the angle $\theta$.

The counter 20 will continue to be incremented until the value of $\phi$ just exceeds the value of $\theta$. At that point, the output of the comparator will switch and cause the counter 20 to count down. After a single count, $\phi$ will again be less than $\theta$ and the output of the comparator 30 will switch, thus causing the counter 20 to again count up. Thus, it can be seen that after the counter has had sufficient time to catch up with the encoder phase angle $\theta$, it will continue to track the encoder phase angle so that $\phi$ will approximately equal $\theta$ and k sin $(\theta - \phi)$ will be approximately zero. The counter will continuously vary one count around the encoder phase angle (e.g., if the encoder phase angle is 37.5 degrees, the counter may alternate between 37 degrees and 38 degrees).

If the encoder phase angle $\theta$ is varying, the system will try to keep up with it, i.e., the counter 20 will be incremented or decremented in an attempt to track $\theta$. The tracking speed is affected by the frequency of an oscillator 32 which is used to clock the counter. That is, the direction of counting is controlled by the output of the comparator 30 and the speed of counting is controlled by the oscillator 32. The higher the oscillator frequency, the faster the tracking will be.

Since the counter will continuously vary one count around the encoder phase angle, it is desirable to include circuitry which will provide a stable output. This is accomplished by utilizing a sampling register 34 in conjunction with sampling control circuitry comprised of an OR gate 36. The OR gate causes the register 34 to sample the output of the counter 20 only on even counts. In this manner, the digital output of the sampling register will not track each count as the counter varies around the phase angle but rather will be maintained at a stable value.

Practical implementation of the circuit of FIG. 1 involves the use of absolute values of both the encoder signals V1 and V2 and the outputs of the memories 22 and 24. This is due to the fact that the multiplying digital-to-analog converters 16 and 18 can only operate in one quadrant. In order to provide the proper control signals to the counter 20, the polarities of the encoder signals and memory signals can be analyzed in conjunction with the polarity of the comparator output in order to determine the true polarity of the term k sin $(\theta - \phi)$. Circuitry for performing this function is shown in detail in FIG. 2. The polarities of the various input signals to the converters 16 and 18 are also indicated in these FIGURES. PCE represents the polarity of the cosine of the encoder output, i.e., the polarity of V1. PSE represents the polarity of the sine of the encoder output (V2). PSC and PCC represent the polarity of the sine and cosine signals provided by the memories 22 and 24, respectively. PDIF represents the polarity of the difference of the absolute values of the converter outputs, i.e., the polarity of the comparator output.

The logic arrangement for determining the polarity of k sin $(\theta - \phi)$ involves a multiplication of the polarities of the inputs to the converters. If sin $\theta$ cos $\phi$ is of greater absolute value, then sign (sin $(\theta - \phi)$) = sign (sin $\theta$ cos $\phi$) = sign (sin $\theta$)·sign (cos $\phi$). Similarly, if cos $\theta$ sin $\phi$ (the output of the converter 16) is of greater absolute value then sign (sin $(\theta - \phi)$) = -sign (cos $\theta$)·sign (sin $\phi$). In these equations, the sign of a function is equal to +1 if the function is positive and -1 if it is negative.

The multiplication of the signs of the various inputs to the converters is accomplished by means of exclusive OR gates 40 and 42, with positive values of the functions being represented by a logical zero and negative values by a logical one. The gate 40 multiplies the signals PSE and PCC in order to provide the polarity of sign (sin $\theta$)·sign (cos $\phi$). Similarly, the gate 42 multiplies the polarity signals PCE and PSC to determine the polarity of the term sign (cos $\theta$) sign (sin $\phi$), with the output being inverted by an inverter 46. The outputs of the gate 40 and the inverter 46 are connected to inputs to AND gates 44 and 48, respectively. The output of the comparator 30 (PDIF) is connected to one input of the AND gate 48 and is inverted by an inverter 50, the output of which is connected to an input of the AND gate 44. The outputs of the gates 44 and 48 are connected to an OR gate 52. If sin $\theta$ cos $\phi$ is of greater absolute value, the comparator output will be positive and the signal PDIF will be logical zero. This will enable the gate 44, thus passing the output of the gate 40 to the output of the logic circuit. Similarly, if cos $\theta$ sin $\phi$ is of greater absolute value, then the inverted output of the gate 42 will be passed to the output of the logic circuit. The circuit 38 thus provides an output PSD which represents the true polarity of k sin $(\theta - \phi)$. This signal can then be utilized to provide proper control signals to the counter 20.

The design of the present invention is such that an analog signal representing the velocity of the encoder may be obtained by the addition of low pass filter 54 connected to the output of the comparator 30 via a level shifter 52. The input signal to the low pass filter 54 is $+V$ when the counter 20 is counting upward and $-V$ when the counter is counting downward. The output of the filter 54 is proportional to the difference in the frequency of up counts versus down counts. Where the system is at rest the number of up counts is equal to the number of down counts. When the system is in motion the ratio between the two counts is altered in proportion to the system velocity. The polarity of the filter output indicates the direction of encoder movement.

In summary, the present invention provides an accurate digital output representative of the phase angle of an encoder given analog sine and cosine inputs. The circuit operates on the basis of the trigonometric identity sin $\theta$ cos $\phi$ - cos $\theta$ sin $\phi$ = sin $(\theta - \phi)$, and provides an accurate digital output regardless of any variations in the amplitude of the input signals (i.e., the value of k in the input signals V1 and V2 does not affect the output of the counter 20). A stable output can be provided by means of sampling circuitry, and an analog velocity indication can be obtained by the addition of a low pass filter.

I claim:

1. A digitizer for receiving analog signals representing the sine and cosine of an unknown angle and providing a digital output of the angle, comprising:
   a bidirectional counter for providing a digital signal representative of a reference angle;
   first means for providing digital signals representative of the sine and cosine of the reference angle;
   multiplication means for providing a first analog signal representative of the product of the sine of the unknown angle and the cosine of the reference angle and a second analog signal representative of the product of the cosine of the unknown angle and the sine of the reference angle;

comparison means for comparing the first and second analog signals, wherein the output of the comparison means causes the counter to vary the value of the reference angle until it is equal to the unknown angle, whereby the output of the counter is a digital representation of the unknown angle;

sampling means including a sampling register for receiving and storing the output of the counter and logic circuitry for controlling the operation of the sampling register; and a clock for controlling the counting of the counter, wherein the logic circuitry receives a clock signal from the clock and a signal representing the least significant bit of the counter output and provides a control signal to the sampling register to receive the output of the counter on alternate counts thereof to thereby provide a stable digital output representation of the unknown angle.

2. A digitizer according to claim 1 wherein the logic circuitry comprises an OR gate.

* * * * *